US012666639B2

(12) United States Patent
Liu

(10) Patent No.: US 12,666,639 B2
(45) Date of Patent: Jun. 23, 2026

(54) GATE ALL-AROUND LATERALLY DIFFUSED METAL-OXIDE SEMICONDUCTOR FIELD EFFECT TRANSISTOR

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 303 days.

(21) Appl. No.: 18/361,776

(22) Filed: Jul. 28, 2023

(65) Prior Publication Data
US 2025/0040169 A1     Jan. 30, 2025

(51) Int. Cl.
| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 62/17* | (2025.01) |

(52) U.S. Cl.
CPC ......... *H10D 30/43* (2025.01); *H10D 30/6735* (2025.01); *H10D 62/121* (2025.01); *H10D 62/151* (2025.01); *H10D 62/371* (2025.01)

(58) Field of Classification Search
CPC .. H10D 30/43; H10D 30/6735; H10D 62/121; H10D 62/151; H10D 62/371; H10D 30/603; H10D 30/6757; H10D 30/501; H10D 62/114; H10D 64/111; H10D 84/0128; H10D 84/013; H10D 84/8311; H10D 84/8312; H10D 84/832; H10D 84/836; H10D 62/364; H10D 62/159; B82Y 10/00
See application file for complete search history.

(56) References Cited

U.S. PATENT DOCUMENTS

| | | | | |
|---|---|---|---|---|
| 10,505,020 | B2 * | 12/2019 | Liu ...................... | H10D 30/024 |
| 10,679,890 | B2 * | 6/2020 | Reznicek ............. | H10D 30/014 |
| 11,094,782 | B1 * | 8/2021 | Trivedi ................ | H10D 62/121 |
| 11,195,911 | B2 * | 12/2021 | Xie ....................... | H10D 62/116 |
| 11,527,612 | B2 * | 12/2022 | Glass ................... | H10D 62/121 |
| 2016/0071729 | A1 * | 3/2016 | Hatcher ............... | H10D 30/673 |
| | | | | 438/157 |
| 2017/0200738 | A1 * | 7/2017 | Kim ..................... | H10D 30/014 |
| 2018/0323259 | A1 * | 11/2018 | Holland ............. | H10D 30/0243 |
| 2019/0341467 | A1 * | 11/2019 | Basker ............... | H10D 30/0243 |

(Continued)

OTHER PUBLICATIONS

Partial European Search Report, European Application No. 24190973.8 dated Feb. 18, 2025, 14 pages.

(Continued)

*Primary Examiner* — Ibrahim A Khan

(74) *Attorney, Agent, or Firm* — King Intellectual Asset Management

(57) ABSTRACT

A gate all-around laterally diffused metal-oxide semiconductor device is provided. An apparatus includes a substrate, two or more first sheets disposed on the substrate, a gate disposed on the substrate and at least part of the two or more first sheets, and a first epitaxial layer disposed on the substrate on a first side of the gate and at least part of the two or more first sheets. At least part of the two or first more sheets extends longitudinally from the gate to the first epitaxial layer.

20 Claims, 4 Drawing Sheets

(56) References Cited

U.S. PATENT DOCUMENTS

| | | | |
|---|---|---|---|
| 2020/0027959 A1* | 1/2020 | Cheng ................. | H10D 64/017 |
| 2020/0105761 A1* | 4/2020 | Liaw ................. | H10D 84/0167 |
| 2022/0190134 A1* | 6/2022 | Jeong ................. | H10D 30/014 |
| 2022/0262948 A1 | 8/2022 | Jin et al. | |
| 2022/0278110 A1* | 9/2022 | Liaw ..................... | G11C 5/025 |
| 2023/0033790 A1* | 2/2023 | Liaw ................. | H10D 30/6713 |
| 2023/0067804 A1* | 3/2023 | Shen .................. | H10D 62/118 |
| 2023/0327025 A1* | 10/2023 | Wang ................. | H10D 30/6757 |
| | | | 257/288 |
| 2023/0380130 A1* | 11/2023 | Chou ................. | H10D 30/6729 |
| 2024/0008241 A1* | 1/2024 | Liaw .................. | H10B 10/125 |
| 2024/0243133 A1* | 7/2024 | Liaw .................. | H10D 84/907 |
| 2024/0413242 A1* | 12/2024 | Edwards ............. | H10D 62/116 |
| 2024/0431089 A1* | 12/2024 | Liaw .................. | H10B 10/125 |

OTHER PUBLICATIONS

Summons to attend oral proceedings pursuant to Rule 115(1) EPC and communication from the Examining Division, European Application No. 24190973.8 dated Feb. 16, 2026, 12 pages.

* cited by examiner

GATE ALL-AROUND LATERALLY DIFFUSED METAL-OXIDE SEMICONDUCTOR FIELD EFFECT TRANSISTOR

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for a gate all-around laterally-diffused metal-oxide semiconductor field-effect transistors.

BACKGROUND

Gate all-around (GAA) platforms have established themselves as the paradigm in complementary metal-oxide semiconductor (CMOS) technology. As GAA continues to scale with advanced CMOS process nodes. In the context of laterally-diffused metal-oxide semiconductor (LDMOS), fin-based field effect transistors (LDMOS) have been utilized for scalability and space savings. However, as process nodes continue to become smaller, fin-based structures have been unable to be scaled accordingly.

Thus, methods, systems, and apparatuses for a GAA LDMOS are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
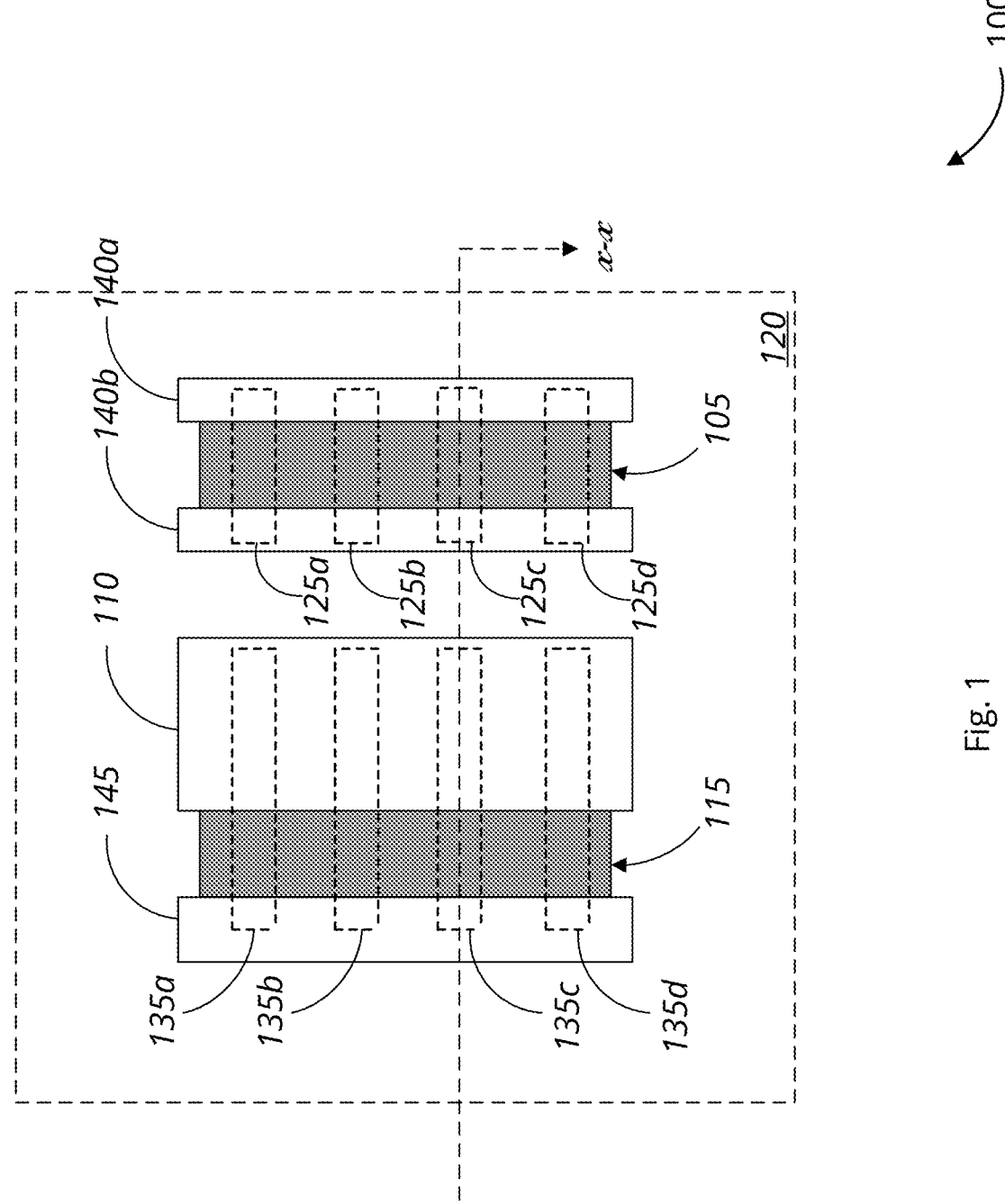
FIG. 1 is a schematic top view of a GAA LDMOS FET, in accordance with various embodiments.

Various embodiments set forth a GAA LDMOS field effect transistor (FET).

In some embodiments, an apparatus for a GAA LDMOS FET is provided. The apparatus includes a substrate, two or more first sheets disposed on the substrate, a gate disposed on the substrate and at least part of the two or more first sheets, and a first epitaxial layer disposed on the substrate on a first side of the gate and at least part of the two or more first sheets. The two or first more sheets may extend, at least in part, from the gate to the first epitaxial layer.

In further embodiments, a semiconductor die for a GAA LDMOS FET is provided. The semiconductor die includes a substrate and a laterally-diffused metal-oxide semiconductor transistor disposed on the substrate. The laterally-diffused metal-oxide semiconductor transistor includes a gate, source, and two or more first sheets disposed on the substrate. The gate includes gate dielectric layer disposed on the substrate, the source includes a first epitaxial layer disposed on the substrate on a first side of the gate dielectric layer, and the two or more first sheets extends, at least in part, from the gate dielectric layer to the first epitaxial layer.

In further embodiments, a semiconductor device for a GAA LDMOS FET is provided. The semiconductor device includes a gate, source, and two or more sheets. The gate may be disposed on a substrate and at least part of the two or more first sheets. The source includes a first epitaxial layer disposed on the substrate on a first side of the gate and at least part of the two or more first sheets. The two or more sheets may be disposed on the substrate, and extend, at least in part, from the gate to the first epitaxial layer.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having." as well as other forms, such as "includes," "included." "has," "have." and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C." or alternatively, "at least one of A, at least one of B, and at least one of C." it is expressly described as such.

LDMOS transistors, and specifically fin-based LDMOS transistors (LDMOS LDMOS), have been unable to scale in current and planned 3 nm and 2 nm process nodes. Accordingly, a GAA FET in LDMOS configuration is set forth below. Specifically, by forming an LDMOS using GAA, a high-voltage (relative to CMOS) GAA device may be realized at the 2 nm and 3 nm CMOS process nodes, without need for changes or additional steps in the process.

FIG. 1 is a schematic top view of a GAA LDMOS FET 100 (hereinafter "LDMOS 100"), in accordance with various embodiments, in accordance with various embodiments. The LDMOS 100 includes a drain region 105, gate 110, and source region 115 disposed on a substrate 120. The LDMOS 100 further includes one or more first nanosheet stacks 125a-125d (collectively "the first nanosheet stacks 125"), one or more second nanosheet stacks 135a-135d (collectively "the second nanosheet stacks 135"), a first drain-side dummy gates 140a and second drain-side dummy gate 140b (collectively "the drain-side dummy gates 140), and source-side dummy gate 145. It should be noted that the various parts and components of LDMOS 100 are schematically illustrated in FIG. 1, and that modifications to the various components and other arrangements of LDMOS 100 may be possible and in accordance with the various embodiments.

In various embodiments, the structures of the LDMOS 100 may be disposed on substrate 120. Accordingly, the substrate 120 may be a semiconductor substrate, such as, without limitation, bulk silicon. In some embodiments, the substrate 120 includes a lightly doped ("p$^-$" or "n$^-$") silicon substrate. For example, in the case of an n-type LDMOS (NLDMOS), the substrate 120 may be lightly boron doped (e.g., p$^-$), in which well regions may be formed (e.g., p-well and n-well). Thus, the substrate 120 may further include more heavily doped ("p$^+$" or "n$^+$") regions, respectively doped with n-type (e.g., phosphorous) and p-type dopants (e.g., boron). A well (referred to interchangeably as "well region"), accordingly, refers to a doped region formed within the substrate 145, which serves as the "bulk" or "body" of the LDMOS 100, on (or in) which other parts of the device are formed, such as the drain region 105, gate 110, source region 115, first nanosheet stacks 125, second nanosheet stacks 135, drain side dummy gates 140, and source-side dummy gate 145. A "p-well" refers to a well with p-type doping, and an "n-well" refers to a well with n-type doping.

In the embodiments above, and further embodiments set forth below, boron and phosphorous are provided as non-limiting examples, and it is to be understood that in other embodiments, other dopants may be utilized. For example, suitable dopants may include, without limitation, pentavalent atoms (e.g., arsenic, phosphorous, antimony, bismuth, lithium, etc.) for n-type doping and trivalent atoms (e.g., indium, aluminum, gallium, boron, etc.) for p-type doping.

In various embodiments, one or more first nanosheet stacks 125a-125d and one or more second nanosheet stacks 135a-135d may be disposed on the substrate 120. In some examples, the one or more first nanosheet stacks 125a-125d and one or more second nanosheet stacks 135a-135d may only include a single respective nanosheet stack (e.g., one first nanosheet stack 125 and one second nanosheet stack 135). Nanosheet stacks may be formed using various processes, including, without limitation, growing and/or depositing the nanosheet stacks onto the substrate 120 (e.g., via an epitaxial process), forming the nanosheet stacks via lithography and/or etching, or a combination of processes.

Nanosheets, as used herein, refer to two-dimensional sheet-like nanostructures, with thickness ranging from 1-100 nm. In some examples, the nanosheet thickness may be in the range of 5-9 nm, while in other examples, the nanosheet may be less than 5 nm. The width and length of individual nanosheets may vary, as the dimensions may be determined based on the respective application. In various examples, the nanosheets may be referred to as having a length that extends in a "longitudinal direction," and a width that extends in a "transverse direction". Nanosheets may be formed of semiconducting material, as described above with respect to the substrate 120.

Accordingly, a nanosheet stack, as used herein, refers to a stack of two or more nanosheets. The nanosheet stack may, in some examples, be referred to as being "vertically stacked," in which the nanosheets are disposed (e.g., stacked) over each other, above the "horizontal" plane defined by a top surface of the substrate 120. In some examples, a nanosheet stack, such as the first and second nanosheet stacks 125, 135, may be stacks of nanosheets formed by alternating semiconductor materials. In one example, the nanosheet stack may include alternating layers of silicon (Si) and silicon germanium (SiGe) nanosheets, where each layer refers to a respective type of nanosheet. In yet further examples, the nanosheets may be formed from the same material as the substrate.

Moreover, as previously described, in some embodiments, each layer of the nanosheet may itself comprise one or more layers. For example, a Si nanosheet layer may itself be formed from one or more layers of Si nanosheet. Thus, in the nanosheet stack described above, the Si nanosheet layer may be followed by a layer of SiGe which respectively comprises one or more layers of SiGe nanosheet. In other embodiments, other materials may be utilized.

In yet further examples, individual nanosheet layers of the nanosheet stack (e.g., first nanosheet stack 125 or second nanosheet stack 135) may be separated by dielectric spacers, such as metal oxide spacers. For example, the nanosheet stack may include alternating layers of different materials, such as a silicon nanosheet and a dielectric spacer. Thus, in some embodiments, the nanosheet stack may include alternating layers of Si nanosheet and dielectric spacer.

In various embodiments, individual nanosheets may be configured to provide a respective channel between the gate 110 and source region 115. Alternatively, as will be described below in greater detail with respect to FIG. 3, a channel between the drain and source regions 105, 115 (305, 315).

In contrast with fins conventionally found in FinFETs, nanosheet stacks are able to provide improved direct current (DC) performance and better control over short channel effects (SCE).

The gate 110, drain-side dummy gates 140a-140b, and source-side dummy gate 145 may then be formed by deposition of gate oxide (e.g., a dielectric layer) over the first and second nanosheet stacks 125, 135, followed by formation of the gate 110 and drain-side and source-side dummy gates 140a-140b, 145 from the gate oxide. In some examples, the gate 110 and/or drain-side and source-side dummy gates 140a-140b, 145 may first be patterned and then deposited onto the substrate 120 and/or the first and second nanosheet stacks 125, 135. In yet further examples, the physical dielectric structure of the gate 110 and/or gate electrode may be referred to as a "gate dielectric layer," and the drain-side and source-side dummy gates 140a-140b, 145 may be referred to as "dummy dielectric layers."

Figure 2:
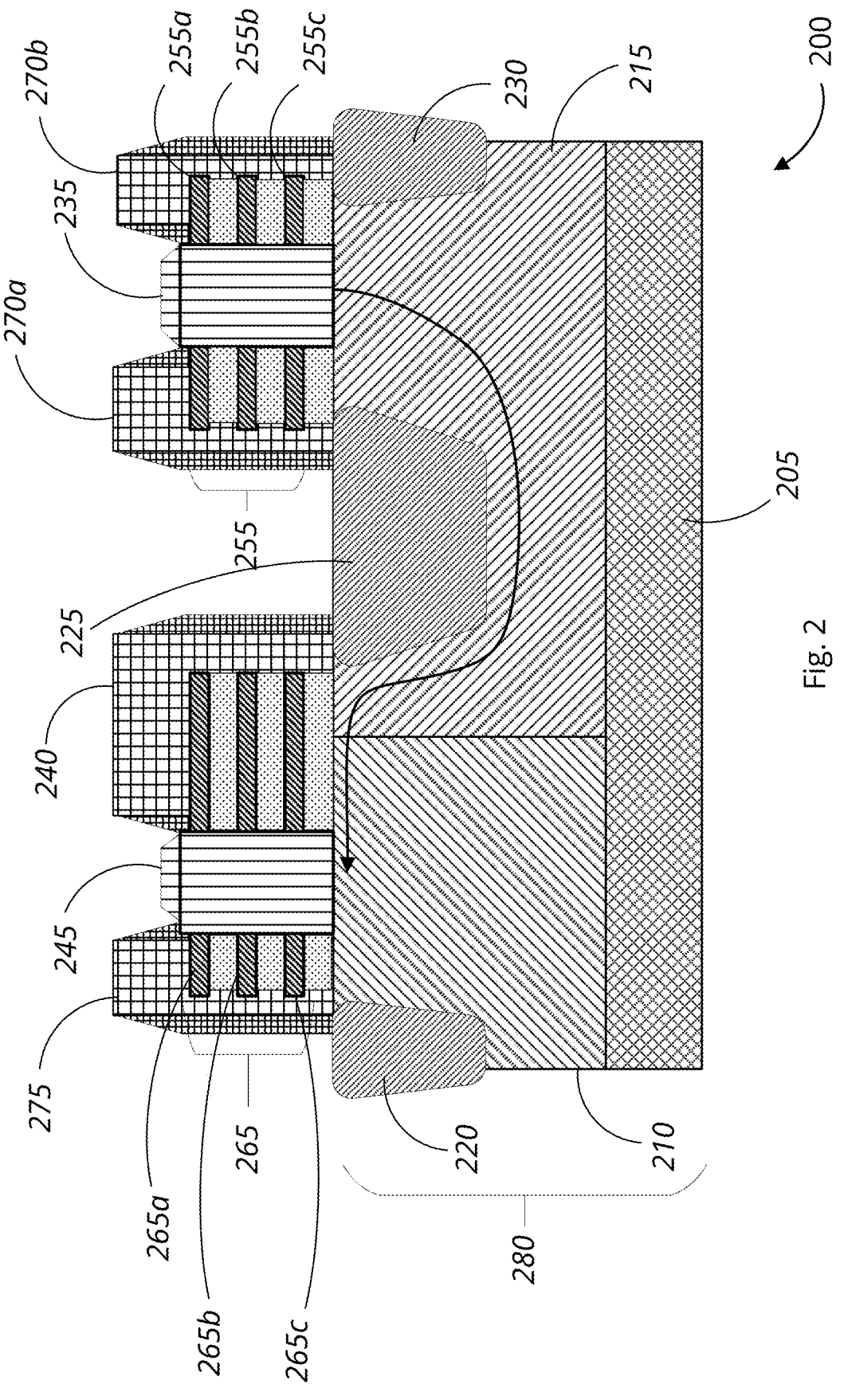
FIG. 2 is a schematic diagram of a cross-section of the GAA LDMOS FET, in accordance with various embodiments.
Figure 4:
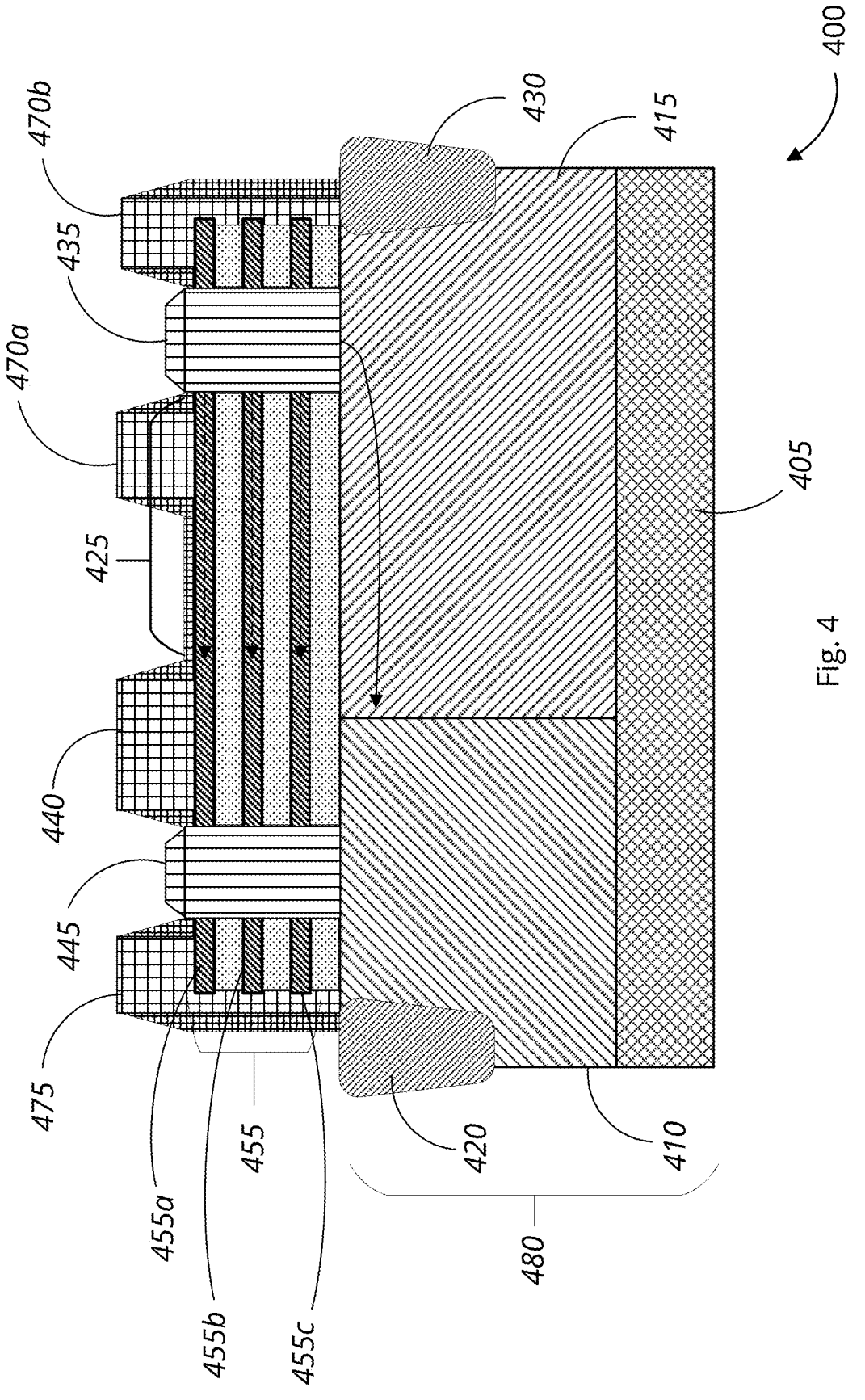
FIG. 4 is a schematic diagram of a cross-section of the alternative GAA LDMOS FET, in accordance with various embodiments.

Dummy gates, as used herein, refer to inactive gate structures used for various purposes. In various examples, dummy gates may be used as structural support (as depicted in FIGS. 2 and 4 to support the raised source/drain (RSD) epitaxial structures, and/or the first and second nanosheet stacks 125, 135), electrical biasing, electrical isolation, and/or as a placeholder structure to later be removed or replaced.

In various embodiments, the drain region 105 may be disposed on a first side of the gate 110, between the drain side dummy gates 140a-140b. In some embodiments, the drain region 105 includes a highly doped part of the first nanosheet stacks 125. In various examples, the first nanosheet stacks 125 may include a highly doped portion that is doped in-situ to form at least part of the drain region 105. In some examples, in the case of an NLDMOS, all or part of the first nanosheet stacks 125 may be in-situ phosphorous doped. In other examples, the nanosheets may be undoped nanosheets.

In some embodiments, an RSD epitaxial layer (hereinafter referred to as "epitaxial layer") may be formed over the nanosheet stacks. The epitaxial layer may refer to a structure/layer grown via an epitaxial process. In this example, the epitaxial layer may form, at least part, of an RSD. The epitaxial layer may be heavily doped, forming the drain structure (also referred to as "drain/source") of the drain region 105. The drain region 105 may be referred to interchangeably as the "drain" or "drain/source" of the LDMOS 100. In some examples, the epitaxial layer may be configured to connect transversely the one or more first nanosheet stacks 125a-125d to one another. For example, the epitaxial layer may extend longitudinally, such that the epitaxial layer traverses the one or more first nanosheet stacks 125a-125d, as depicted in FIG. 1.

Similarly, the source region 115 may be disposed on a second side of the gate 110 (e.g., opposite from the first side of the gate 110). For example, in some embodiments, the source region 115 is disposed between source-side dummy gate 145 and the gate 110. Like the drain region 105, the source region 115 may include a highly doped portion of the second nanosheet stacks 135. Specifically, the second nanosheet stacks 135 may include a first highly doped portion that is doped in-situ to form at least part of the source region 115. In some examples, in the case of an NLDMOS, a first portion of the second nanosheet stacks 135 may be in-situ phosphorous doped. In other examples, the nanosheets of the second nanosheet stack may be undoped.

A source-side epitaxial layer (e.g., RSD epitaxial layer) may be formed over the second nanosheet stacks 135, forming the source (also referred to as a "source/drain"), as part or in addition to the in-situ doping process. The source region 115 may be referred to interchangeably as the "source" or "source/drain" of the LDMOS 100. In some examples, the source-side epitaxial layer may be configured to connect transversely the one or more second nanosheet stacks 135a-135d to one another. For example, the epitaxial layer of the source region 115 may extend in a longitudinal direction such that it traverses the one or more second nanosheet stacks 135a-135d, extending in a longitudinal direction, as depicted in FIG. 1.

FIG. 2 is a schematic diagram of a cross-section of the LDMOS 100, 200 taken across line x-x, in accordance with various embodiments. The sectional view of LDMOS 200 shows the different portions and structures described above, but obscured in the top view. Accordingly, LDMOS 200 includes a substrate 280, having an undoped/lightly doped region 205, a first well region 210, and second well region 215, a first trench isolation region 220, second trench isolation region 225, and third trench isolation region 230, drain region 235, gate 240, source region 245, first nanosheet stack 255, second nanosheet stack 265, drain-side dummy gates 270a-270b, and source-side dummy gates 275. It should be noted that the various parts and components of LDMOS 200 are schematically illustrated in FIG. 2, and that modifications to the various components and other arrangements of LDMOS 200 may be possible and in accordance with the various embodiments.

As shown in the cross-sectional view, the substrate 280 may include an undoped/lightly doped region 205. In various examples, the substrate 280 may be lightly doped. In an NLDMOS, for example, the undoped/lightly doped region 205 is lightly boron doped (e.g., p-type). In various examples, the substrate 280 further includes a first well region 210 and second well region 215. In various examples, the well regions 210, 215 may be doped regions of the substrate 280. For example, in an NLDMOS, the first well region 210 may be p-type doped (e.g., boron doped), and the second well region 215 may be n-type doped (e.g., phosphorous doped). In various examples, the substrate 280 further includes trench isolation regions, such as first through third trench isolation regions 220-230. Trench isolation regions may be trenches formed in the substrate, and filled with an oxide material. In some examples, one or more of the first, second, and third trench isolation regions 220-230 may be shallow trench isolation (STI) regions. In some examples, one or more of the first, second, and third trench isolation regions 220-230 may be deep trench isolation (DTI) regions.

The first and second nanosheet stacks 255, 265 may be disposed on the substrate 280, with the first nanosheet stack 255 disposed on the second well region 215, and the second nanosheet stack 265 at least partially disposed on the first well region 210, and at least partially disposed on the second well region 215. In some examples, the second nanosheet stack 265 may act as channels for current flow between gate and source. The first nanosheet stack 255 may, in turn, provide greater effective width as compared to a fin, allowing for higher drive currents.

Accordingly, in various embodiments, the drain region may be disposed between the third trench isolation region 230 and second trench isolation region 225, with the respective nanosheets 255a-255c of the first nanosheet stack 225 disposed, at least partially, over and spanning between the second and third trench isolation regions 225, 230. By providing the drain region 235 adjacent to the second and third trench isolation regions 225, 230, a lightly-doped drain (LDD) region may be formed directly under the drain region 230 in the second well region 215 between the second and third trench isolation regions 225, 230, creating a current path from the drain region 235, through the second well region 215, to the drain region 245. In this way, a GAA structure may be utilized for high-voltage LDMOS operation.

Figure 3:
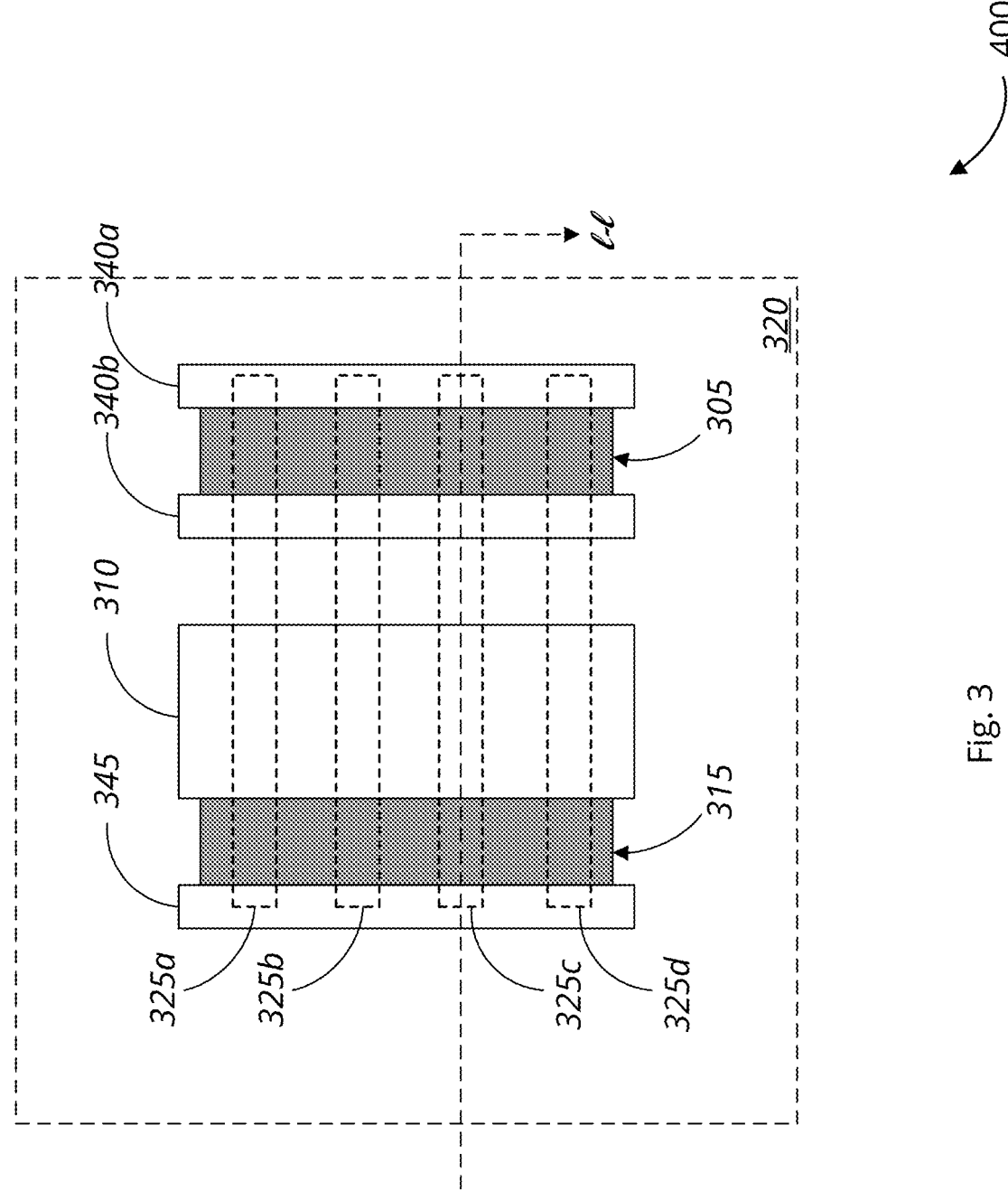
FIG. 3 is a schematic top view of an alternative GAA LDMOS FET, in accordance with various embodiments.

FIG. 3 is a schematic top view of an alternative configuration for a GAA LDMOS FET 300 (hereinafter "LDMOS 300"), in accordance with various embodiments, in accordance with various embodiments. The LDMOS 300 includes a drain region 305, gate 310, and source region 315 disposed on a substrate 320. The LDMOS 300 further includes one or more nanosheet stacks 325a-325d (collectively "nanosheet stacks 325"), a first drain-side dummy gates 340a and second drain-side dummy gate 340b (collectively "the drain-side dummy gates 340), and source-side dummy gate 345. It should be noted that the various parts and components of LDMOS 300 are schematically illustrated in FIG. 3, and that modifications to the various components and other arrangements of LDMOS 300 may be possible and in accordance with the various embodiments.

As previously described with respect to FIG. 1, the structures of the LDMOS 300 may be disposed on substrate 320. Accordingly, the substrate 320 may be a semiconductor substrate, such as, without limitation, bulk silicon. In various embodiments, the one or more nanosheet stacks 325a-325d may be disposed on the substrate 320. In some examples, the one or more nanosheet stacks may only include a single nanosheet stack (e.g., one nanosheet stack 325).

In some examples, the nanosheet stacks 325 may be stacks of nanosheets formed by alternating semiconductor materials, as previously described. In yet further examples, the nanosheets may be formed from the same material as the substrate. In yet further examples, the nanosheet stack 325 may be formed from alternating layers of nanosheets and spacers. As previously described, individual nanosheet layers of the nanosheet stack 325 may be separated by dielectric spacers, such as metal oxide spacers.

In contrast with the nanosheet stacks 125, 135 of LDMOS 100 of FIG. 1, the nanosheets of the nanosheet stacks 325 of LDMOS 300 spans across the drain region 305, gate 310, and source region 315. In some examples, the nanosheets may be continuous (e.g., are structurally continuous) from the first drain-side dummy gate 340 (e.g., disposed at least partially within the first dummy gate 340) to the source-side dummy gate 345. In this way, individual nanosheets may be configured to provide respective channels from the source region 305 to the source region 315 (e.g., more specifically, from the drain region 305 to the gate 310, and from the gate 310 to the source region 315).

The gate 310, drain-side dummy gates 340a-340b, and source-side dummy gate 345 may then be formed by deposition of gate oxide (e.g., a dielectric layer) over the nanosheet stacks 325, followed by formation of the gate 310 and drain-side and source-side dummy gates 340a-340b, 345 from the gate oxide. In various embodiments, the drain region 305 may be disposed on a first side of the gate 310, between the drain side dummy gates 340a-340b. In some embodiments, the drain region 305 includes a highly doped part of the nanosheet stacks 325. In various examples, the nanosheet stacks 325 may include a highly doped portion that is doped in-situ to form at least part of the drain region 305. In some examples, in the case of an NLDMOS, all or part of the nanosheet stacks 325 may be in-situ phosphorous doped. In other examples, the nanosheets may be undoped nanosheets.

In some embodiments, an RSD epitaxial layer (hereinafter referred to as "epitaxial layer") may be formed over the nanosheet stacks. The epitaxial layer may be heavily doped, forming the drain structure (also referred to as "drain/source") of the drain region 305. In some examples, the epitaxial layer may be configured to connect transversely the one or more nanosheet stacks 325a-325d to one another.

The source region 315 may be disposed on a second side of the gate 310 (e.g., opposite from the first side of the gate 310). For example, in some embodiments, the source region 315 is disposed between source-side dummy gate 345 and the gate 310. Like the drain region 305, the source region 315 may include a highly doped portion of the nanosheet stacks 325. Specifically, the nanosheet stacks 325 may include a first highly doped portion that is doped in-situ to form at least part of the source region 315. In some examples, in the case of an NLDMOS, a first portion of the nanosheet stacks 325 may be in-situ phosphorous doped. In other examples, the nanosheets of the second nanosheet stack may be undoped.

A source-side epitaxial layer (e.g., RSD epitaxial layer) may be formed over the nanosheet stacks 325, forming the source (also referred to as a "source/drain"), as part or in addition to the in-situ doping process. In some examples, the source-side epitaxial layer may be configured to connect transversely the one or more nanosheet stacks 325a-325d to one another.

FIG. 4 is a schematic diagram of a cross-section of the LDMOS 300, 400 taken across line 1-1, in accordance with various embodiments. The sectional view of LDMOS 400 shows the different portions and structures described above, but obscured in the top view. Accordingly, LDMOS 400 includes a substrate 480, having an undoped/lightly doped region 405, a first well region 410, and second well region 415, a first trench isolation region 420, LDD region 425, and second trench isolation region 430, drain region 435, gate 440, source region 445, nanosheet stack 455, drain-side dummy gates 470a-470b, and source-side dummy gates 475. It should be noted that the various parts and components of LDMOS 400 are schematically illustrated in FIG. 4, and that modifications to the various components and other arrangements of LDMOS 400 may be possible and in accordance with the various embodiments.

In contrast with the LDMOS 200 of FIG. 2, LDMOS 400 includes a first and second trench isolation regions, such as first and second trench isolation regions 420, 430, the first trench isolation region 420 disposed at one end of the first well region 410, and second trench isolation region 430 disposed at the opposite end of the second well region 415. Notably, a trench isolation region between the first and second trench isolation regions 420, 430 has been removed in favor of an LDD region 425 formed in the area between the gate 440 and source region 435.

As previously described, trench isolation regions may be trenches formed in the substrate, and filled with an oxide material. One or more of the first and second trench isolation regions 420, 430 may be shallow trench isolation (STI) regions. In some examples, one or more of the first and second trench isolation regions 420, 430 may be deep trench isolation (DTI) regions.

The nanosheet stacks 455 may be disposed on the substrate 480, extending across the first and second well regions 410, 415. In various embodiments, the individual nanosheets 455a-455c of the nanosheet stacks 455 may be channels for current flow between drain and gate, and further between the gate and source.

By providing an LDD 425 between the drain region 405 and gate 445, a current path is created through the nanosheets 455a-455c, as well as through the second well region 415. By providing an LDD region through the nanosheet stack 455. In this way, a GAA structure may be utilized for high-voltage LDMOS operation, as in LDMOS 300, while further having a reduced on resistance (Ron) (relative to an LDD being formed in the second well region 415) with the LDD 425 being formed by the nanosheet stack 455.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for case of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:
   a substrate;
   two or more first sheets disposed on the substrate;
   a gate disposed on the substrate and at least part of the two or more first sheets;
   a first epitaxial layer disposed on the substrate on a first side of the gate and at least part of the two or more first sheets, wherein at least part of the two or first more sheets extends longitudinally from the gate to the first epitaxial layer;
   two or more second sheets disposed on the substrate on a second side of the gate; and
   a second epitaxial layer disposed on the second side of the gate, and further disposed, at least in part, over the two or more second sheets;
   wherein the substrate further comprises a shallow trench isolation region disposed between the second epitaxial layer and gate, wherein a lightly-doped drain is formed within the substrate under the shallow trench isolation region, between the second epitaxial layer and the gate.

2. The apparatus of claim 1, wherein each first sheet of the two or more first sheets are separated by respective dielectric spacers.

3. The apparatus of claim 1, wherein the two or more first sheets are further disposed, at least in part, within the first epitaxial layer, wherein the first epitaxial layer is grown over the two or more first sheets.

4. The apparatus of claim 1, wherein each second sheet of the two or more second sheets are separated from each other by respective dielectric spacers.

5. The apparatus of claim 1, wherein each respective first sheet of the two or more first sheets and each respective second sheet of the two or more second sheets are connected as part of the same sheet, wherein each sheet is continuous from the first epitaxial layer to the second epitaxial layer, and wherein the two or more first sheets and two or more second sheets are respectively parts of two or more channels coupling the first epitaxial layer and second epitaxial layer.

6. The apparatus of claim 5, wherein the two or more channels form at least part of a lightly-doped drain.

7. The apparatus of claim 5, wherein the two or more channels are disposed on the substrate.

8. The apparatus of claim 1, wherein the apparatus comprises a semiconductor die.

9. The apparatus of claim 1, further comprising one or more dummy dielectric layers disposed on the substrate, wherein the two or more first sheets is configured to extend into the one or more field dielectric layers.

10. The apparatus of claim 1, wherein the two or more first sheets are part of a first nanosheet stack.

11. A semiconductor die comprising:
    a substrate;
    a laterally-diffused metal-oxide semiconductor transistor disposed on the substrate, the laterally-diffused metal-oxide semiconductor transistor comprising:

a gate comprising a gate dielectric layer disposed on the substrate;

a source comprising a first epitaxial layer disposed on the substrate on a first side of the gate dielectric layer; and two or more first sheets disposed on the substrate, wherein at least part of the two or more first sheets extends longitudinally from the gate dielectric layer to the first epitaxial layer;

two or more second sheets disposed on the substrate on a second side of the gate; and a second epitaxial layer disposed on the second side of the gate, and further disposed, at least in part, over the two or more second sheets;

wherein the substrate further comprises a shallow trench isolation region disposed between the second epitaxial layer and gate, wherein a lightly-doped drain is formed within the substrate under the shallow trench isolation region, between the second epitaxial layer and the gate.

12. The semiconductor die of claim 11, wherein the two or more first sheets are further disposed, at least in part, within the first epitaxial layer, wherein the first epitaxial layer is grown over the two or more first sheets.

13. The semiconductor die of claim 11, wherein each respective first sheet of the two or more first sheets and each respective second sheet of the two or more second sheets are connected as part of the same sheet, wherein each sheet is continuous from the first epitaxial layer to the second epitaxial layer, and wherein the two or more first sheets and two or more second sheets are respectively parts of two or more channels coupling the first epitaxial layer and second epitaxial layer.

14. The semiconductor die of claim 13, wherein the two or more channels are disposed on the substrate, and wherein between the gate dielectric layer and the second epitaxial layer, the two or more channels form at least part of a lightly doped drain region.

15. The semiconductor die of claim 11, wherein each first sheet of the two or more first sheets are separated by respective dielectric spacers.

16. A semiconductor device comprising:

a gate disposed on a substrate and at least part of the two or more first sheets;

a source comprising a first epitaxial layer disposed on the substrate on a first side of the gate and at least part of the two or more first sheets; and two or more first sheets disposed on the substrate, wherein at least part of the two or more first sheets extends longitudinally from the gate to the first epitaxial layer;

two or more second sheets disposed on the substrate on a second side of the gate; and a second epitaxial layer disposed on the second side of the gate, and further disposed, at least in part, over the two or more second sheets;

wherein the substrate further comprises a shallow trench isolation region disposed between the second epitaxial layer and gate, wherein a lightly-doped drain is formed within the substrate under the shallow trench isolation region, between the second epitaxial layer and the gate.

17. The semiconductor device of claim 16, wherein the two or more first sheets are further disposed, at least in part, within the first epitaxial layer, wherein the first epitaxial layer is grown over the two or more first sheets.

18. The semiconductor device of claim 16 wherein each second sheet of the two or more second sheets are separated from each other by a dielectric spacer.

19. The semiconductor device of claim 16, wherein each respective first sheet of the two or more first sheets and each respective second sheet of the two or more second sheets are connected as part of the same sheet, wherein each sheet is continuous from the first epitaxial layer to the second epitaxial layer, and wherein the two or more first sheets and two or more second sheets are respectively parts of two or more channels coupling the first epitaxial layer and second epitaxial layer.

20. The semiconductor device of claim 19, wherein the two or more channels are disposed, at least in part, over the substrate, and wherein the two or more channels form at least part of a lightly doped drain.

* * * * *